(12) United States Patent
Matsumori

(10) Patent No.: US 7,553,757 B2
(45) Date of Patent: Jun. 30, 2009

(54) SEMICONDUCTOR DEVICE AND METHOD OF MANUFACTURING THE SAME

(75) Inventor: Hisakazu Matsumori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 11/702,135

(22) Filed: Feb. 5, 2007

(65) Prior Publication Data
US 2007/0200237 A1 Aug. 30, 2007

(30) Foreign Application Priority Data
Feb. 6, 2006 (JP) ............... 2006-028053

(51) Int. Cl.
*H01L 21/20* (2006.01)
(52) U.S. Cl. .............. 438/627; 438/637; 438/653; 438/674; 257/762; 257/774; 257/760; 257/E21.376; 257/E21.171; 257/E21.593
(58) Field of Classification Search ............ 438/639, 438/627–637, 653; 257/760, 762, 774, 751–759, 257/E21.376, 171, 593
See application file for complete search history.

(56) References Cited

U.S. PATENT DOCUMENTS

| 6,066,559 | A * | 5/2000 | Gonzalez et al. ............ 438/672 |
| 6,124,203 | A | 9/2000 | Joo et al. |
| 6,433,429 | B1 * | 8/2002 | Stamper ..................... 257/751 |
| 6,686,285 | B2 * | 2/2004 | Miyajima et al. ........... 438/692 |
| 6,887,781 | B2 * | 5/2005 | Lee et al. .................... 438/627 |
| 6,964,919 | B2 | 11/2005 | Kloster et al. |
| 2001/0004550 | A1 * | 6/2001 | Passemard .................. 438/618 |
| 2003/0157794 | A1 * | 8/2003 | Agarwala et al. ........... 438/627 |
| 2003/0194858 | A1 * | 10/2003 | Lee et al. .................... 438/643 |
| 2004/0046261 | A1 | 3/2004 | Ohto et al. |
| 2004/0161928 | A1 * | 8/2004 | Arita et al. .................. 438/674 |
| 2005/0140012 | A1 * | 6/2005 | Jung .......................... 257/762 |
| 2007/0123017 | A1 * | 5/2007 | Sadjadi et al. .............. 438/597 |

FOREIGN PATENT DOCUMENTS

| JP | 8-222569 | 8/1996 |
| JP | 09-162288 | 6/1997 |
| JP | 2000-323479 | 11/2000 |
| JP | 2003-7705 | 10/2003 |
| JP | 2005-129808 | 5/2005 |

OTHER PUBLICATIONS

Notification of Reason(s) for Refusal, mailed Aug. 26, 2008, from the Japan Patent Office in counterpart Patent Application No. 2006-028053.

* cited by examiner

*Primary Examiner*—Michael S Lebentritt
(74) *Attorney, Agent, or Firm*—Finnegan, Henderson, Farabow, Garrett & Dunner, L.L.P.

(57) ABSTRACT

An interlayer insulator includes a first interlayer insulator and a second interlayer insulator formed on the first interlayer insulator and having a property of preventing diffusion of copper. A barrier metal film is formed on an inner wall in the wiring trench except an upper end and operative to prevent copper contained in the Cu wiring from diffusing into the interlayer insulator. The Cu wiring is brought into contact with the second interlayer insulator at the upper end and covered with the barrier metal film at a lower portion below the upper end.

13 Claims, 11 Drawing Sheets

SEMICONDUCTOR DEVICE AND METHOD OF MANUFACTURING THE SAME

CROSS REFERENCE TO RELATED APPLICATION

This application is based on and claims the benefit of priority from prior Japanese Patent Application No. 2006-028053, filed on Feb. 6, 2006, the entire contents of which are incorporated herein by reference.

BACKGROUND OF THE INVENTION

1. Field of the Invention

The present invention relates to a semiconductor device and method of manufacturing the same, and more particularly to a semiconductor device including copper (Cu) used as wiring material and method of manufacturing the same.

2. Description of the Related Art

Copper (Cu) wiring can reduce the parasitic resistance and the parasitic capacity lower than aluminum wiring and accordingly becomes more important as wiring material and via material in a semiconductor device. Different from aluminum (Al) and so forth, however, Cu is difficult to be processed by etching and accordingly the so-called damascene technology is applied for wiring and via formation (For example, see JP-A 8-222569). In a word, processes of photolithography and etching are applied to form a trench in an interlayer insulator for burying Cu wiring therein. A process of CVD (Chemical Vapor Deposition) is then applied to form a barrier metal film composed of a silicon nitride (SiN) over the entire surface of the interlayer insulator including the interior of the trench. Thereafter, a process of spattering or plating is applied to form a Cu film over the entire surface of the silicon nitride including the interior of the trench. Subsequently, CMP (Chemical Mechanical Polishing) is executed to remove Cu from the outside of the trench to form Cu wiring. The above-described barrier metal film is formed to prevent copper from diffusing into the interlayer insulator and degrading the insulation of the interlayer insulator.

In the above semiconductor device and method of manufacturing the same, however, when CMP is executed to remove Cu from the outside of the trench, a chemical reaction resulted from the CMP slurry produces the so-called battery effect between the barrier metal film and the Cu film. As a result, the barrier metal film and/or the Cu film of upper end of the trench melt, and produce a recess as a problem. This recess increases the wiring resistance and the via-hole resistance and reduces the characteristic of Cu wiring, or a low resistivity. It also causes a problem deteriorating the reliability of wiring. In the future, as fine patterning of semiconductor devices increasingly proceeds, the increase in resistance due to the melt is expected to become increasingly serious.

SUMMARY OF THE INVENTION

In one aspect the present invention provides a semiconductor device provided with Cu wiring formed with a copper that are buried in a wiring trench formed in an interlayer insulator, comprising: the interlayer insulator including a first interlayer insulator formed over a semiconductor substrate and a second interlayer insulator formed on the first interlayer insulator; a barrier metal film formed on an inner wall of the wiring trench except an upper part thereof higher than a vicinity of the middle of the second interlayer insulator; and a Cu wiring formed on the barrier metal film and brought into contact with the second interlayer insulator at the upper part of the wiring trench.

In one aspect the present invention provides a method of manufacturing a semiconductor device provided with Cu wiring formed with a metal that are buried in a wiring trench formed in an interlayer insulator, comprising: forming a first interlayer insulator over a semiconductor substrate; forming a second interlayer insulator on the first interlayer insulator; forming a wiring trench through the second interlayer insulator to the first interlayer insulator; forming a barrier metal film on an inner wall in the wiring trench; burying resist in the wiring trench; etching back the barrier metal film to an upper part higher than an interface between the first and second interlayer insulator so as not to expose the interface; peeling off the resist; forming a first Cu wiring layer in the wiring trench, leaving a recess inside the wiring trench; and burying copper in the recess to form a second Cu wiring layer.

In one aspect the present invention provides a method of manufacturing a semiconductor device provided with Cu wiring formed with a metal that are buried in a wiring trench formed in an interlayer insulator, comprising: forming a first interlayer insulator over a semiconductor substrate; forming a wiring trench in the first interlayer insulator; forming a barrier metal film on an inner wall in the wiring trench; burying resist on the barrier metal film; etching back the barrier metal film; peeling off the resist; forming a first Cu wiring layer in the wiring trench, leaving a recess inside the wiring trench; burying copper in the recess to form a second Cu wiring layer; etching back the first interlayer insulator to a downward part lower than an interface between the first Cu wiring layer and the barrier metal film so as to expose the barrier metal film; and forming a second interlayer insulator over the entire surface of the semiconductor device.

DETAILED DESCRIPTION OF THE EMBODIMENTS

Semiconductor devices and methods of manufacturing the same according to the embodiments of the present invention will be described in detail below with reference to the drawings.

First Embodiment

Figure 1:
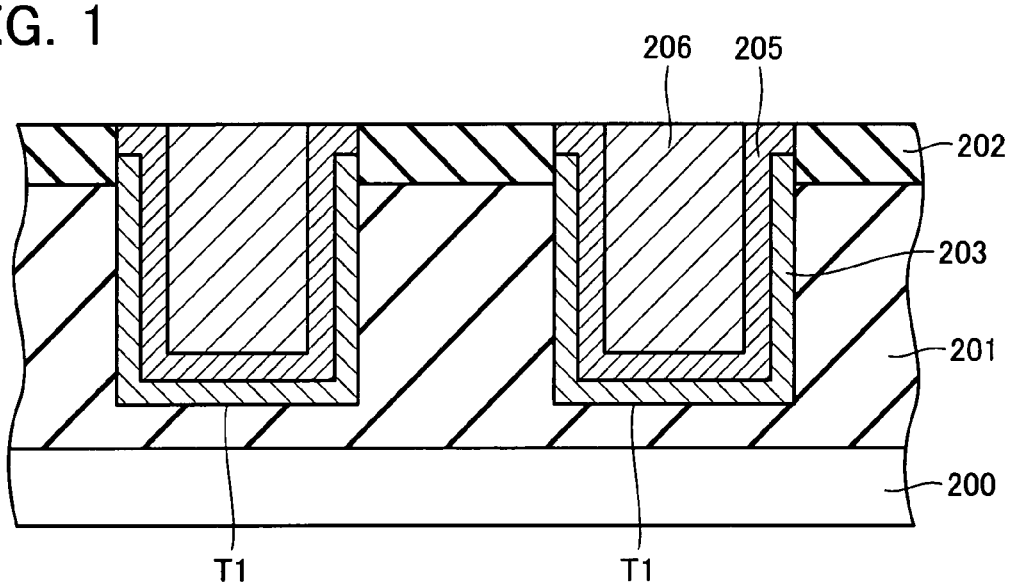
FIG. 1 is a cross-sectional view illustrative of a wiring structure in a semiconductor device according to a first embodiment of the present invention.

FIG. 1 shows a cross-sectional structure of a wiring portion in a semiconductor device according to a first embodiment of the present invention. This semiconductor device comprises a first interlayer insulator 201 and a second interlayer insulator 202 formed over a semiconductor substrate 200. A wiring trench T1 is formed in the first interlayer insulator 201. Cu wiring (205, 206) is formed in the wiring trench T1 on a barrier metal film 203 through a damascene technology for burying and planarizing the metal. A cap layer composed of SiN or the like, not shown, is formed on an upper surface of the Cu wiring and the second interlayer insulator 202 to isolate them from the upper interlayer insulator. The interlayer insulators in this embodiment at least have a double-layered structure including the first interlayer insulator 201 and the second interlayer insulator 202.

The first interlayer insulator 201 is an insulator film that contains part or all of elements of Si, O, N, F, C, H, B and P. For example, it may be formed of an inorganic compound film or an organic compound film, for example, a SiOC-based one. The first interlayer insulator 201 may be formed in a single layer or a laminated film of different films in combination.

The second interlayer insulator 202 is a film having a property of preventing diffusion of copper better than the first interlayer insulator 201 and is mainly composed of SiN, SiC, or SiCN. The second interlayer insulator 202 is formed on the first interlayer insulator 201, for example, through a process of plasma CVD.

In this embodiment, the wiring trench T1 for burying the Cu wiring therein is formed through these two interlayer insulators 201, 202. The barrier metal film 203 is formed on an inner wall in the wiring trench T1 to prevent copper contained in the Cu wiring from diffusing into the interlayer insulator 201. In this embodiment, however, the barrier metal film 203 is formed on portions except an upper end of the inner wall in the wiring trench T1. Specifically, an upper portion of the barrier metal film 203 is formed up to an upper part higher than an interface between the first interlayer insulator 201 and the second interlayer insulator 202, and is formed on portions except an upper part higher than a vicinity of the middle of the second interlayer insulator 202.

The barrier metal film 203 is composed of a material selected from Ta, TaN, TaSiN, Ti, TiN, Mn, MnO, Nb, NbN, WN and WSiN.

The Cu wiring is buried in the wiring trench T1 on the barrier metal film 203 through a damascene technology. In this embodiment, the Cu wiring includes a first Cu wiring layer 205 formed on the barrier metal film 203 in the wiring trench T1 and a second Cu wiring layer 206 formed inside the first Cu wiring layer 205. The first Cu wiring layer 205 may be formed with two or more laminated Cu layers.

The first Cu wiring layer 205 is formed as an underlying layer on formation of the second Cu wiring layer 206 through a process of ECP (Electrochemical plating). If the second Cu wiring layer 206 is formed through a process of CVD, PVD, electroless plating, or the like, the first Cu wiring layer 205 may be omitted.

The second Cu wiring layer 206 is deposited over the semiconductor substrate including the recess inside the first Cu wiring layer 205 through a process of PVD, CVD, electroless plating, electrolytic plating or the like and buried in the recess inside the first Cu wiring layer 205.

As described above, the barrier metal film 203 of this embodiment is formed on the portions except the upper end of the inner wall in the wiring trench T1. Therefore, the Cu wiring layer 205 formed in the wiring trench T1 is brought into contact with the second interlayer insulator 202 at the upper end of the wiring trench T1. In a word, the Cu wiring layer 205 covers the barrier metal film 203.

Figure 2:
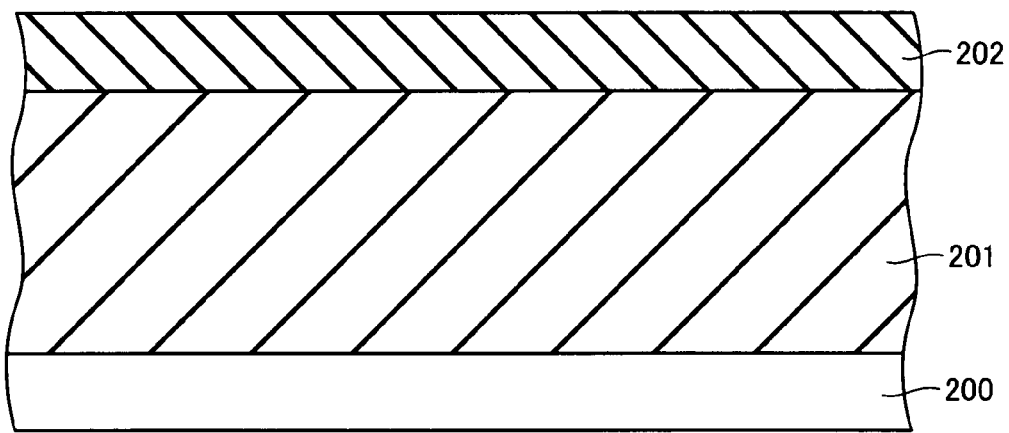
FIG. 2 shows a process step of producing the wiring structure in the semiconductor device of the first embodiment.

Process steps of producing the wiring structure shown in FIG. 1 will be described next with reference to FIGS. 2-9. First, as shown in FIG. 2, the first interlayer insulator 201 is formed over the semiconductor substrate 200 through a process of plasma CVD or coating. Subsequently, the second interlayer insulator 202 (SiN, SiC, SiCN) having a property of preventing diffusion of copper is formed over the first interlayer insulator 201 through a process of plasma CVD.

Figure 3:
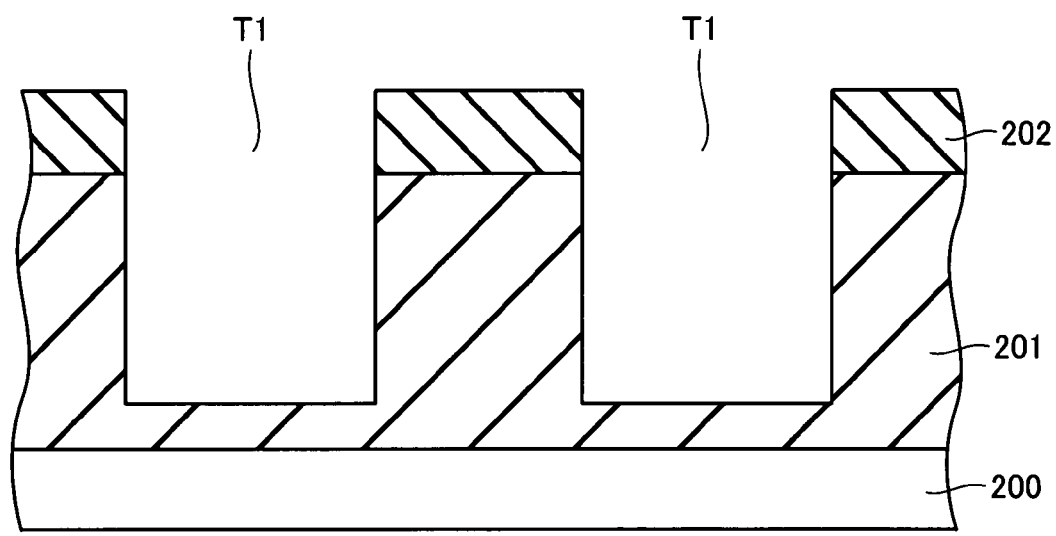
FIG. 3 shows a process step of producing the wiring structure in the semiconductor device of the first embodiment.
Figure 4:
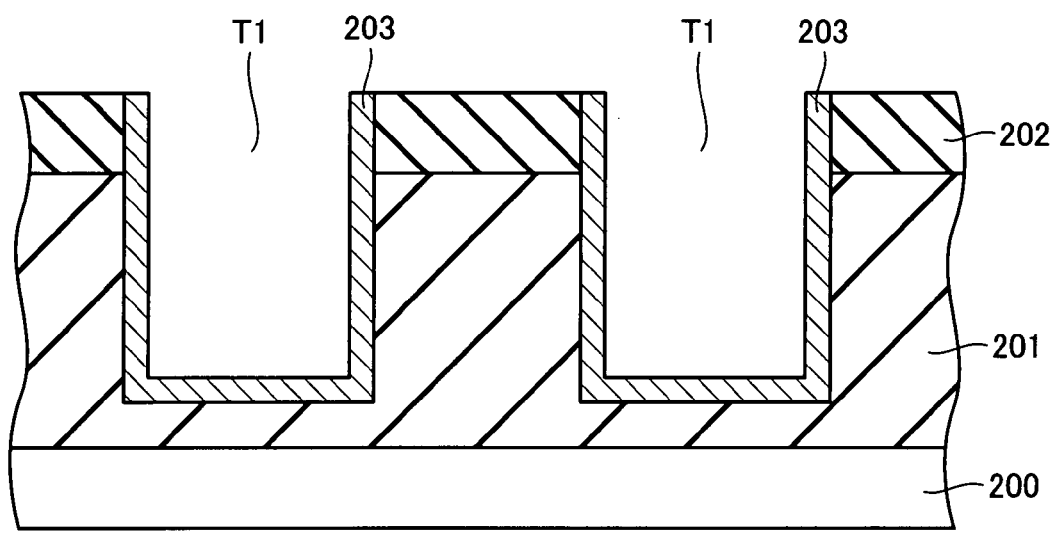
FIG. 4 shows a process step of producing the wiring structure in the semiconductor device of the first embodiment.

Next, a photoresist film is formed over the second interlayer insulator 202 and patterned through a process of photolithography. Thereafter, the patterned photoresist is employed as a mask to form the wiring trench T1 as shown in FIG. 3 through a process of RIE (Reactive Ion Etching). Then, as shown in FIG. 4, the barrier metal film 203 operative to prevent Cu contained in the Cu wiring from diffusing into the first interlayer insulator 201 is formed over the entire inner wall in the wiring trench T1.

Figure 5:
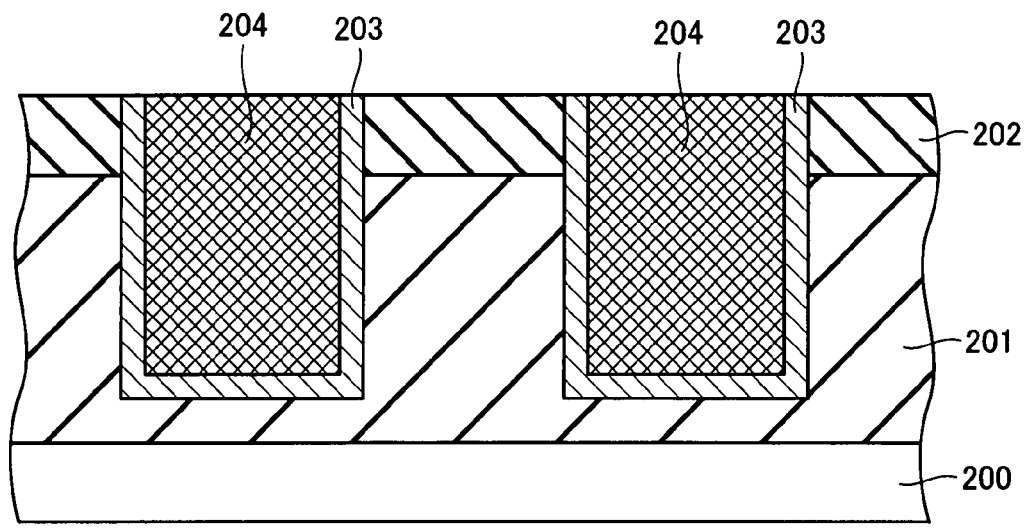
FIG. 5 shows a process step of producing the wiring structure in the semiconductor device of the first embodiment.

Subsequently, as shown in FIG. 5, photoresist 204 is deposited over the semiconductor substrate 200 including the interior of the wiring trench T1. Thereafter, a process of CMP (Chemical Mechanical Polishing) is executed to remove the photoresist 204 from the outside of the wiring trench T1 to fill the interior of the wiring trench T1 with the photoresist 204. In this state the barrier metal film 203 is exposed through the surface at the upper end of the wiring trench T1.

Figure 6:
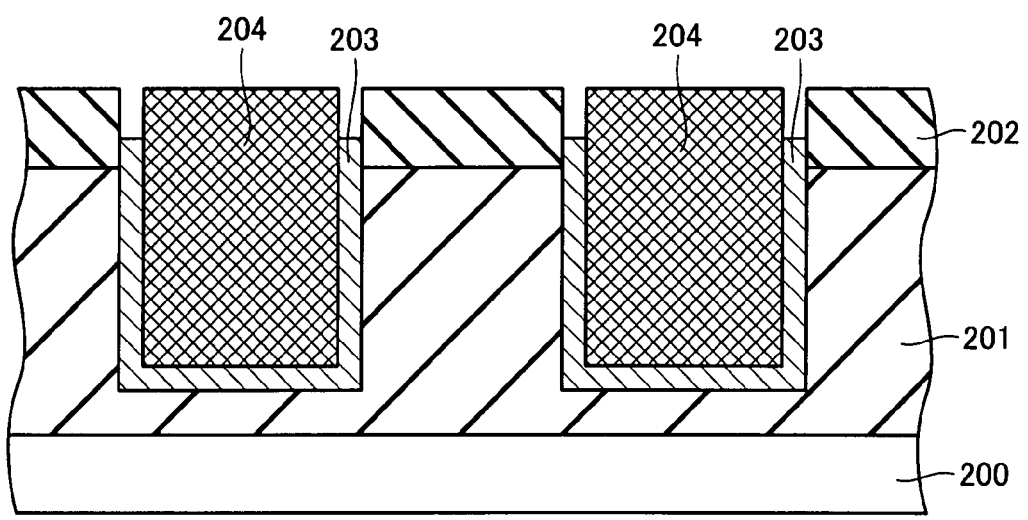
FIG. 6 shows a process step of producing the wiring structure in the semiconductor device of the first embodiment.

Next, the photoresist 204 is employed as a mask to execute a RIE process for etching the upper end of the barrier metal film 203 to a depth that locates in the vicinity of the middle of the second interlayer insulator 202 but does not reach the interface with the first interlayer insulator 201 (see FIG. 6).

In some cases, the barrier metal film 203 may be remained or left near the upper end of the second interlayer insulator 202.

In this case, on executing a CMP after the formation of the Cu wiring layer to polish the Cu wiring layer, the barrier metal film 203 may be exposed. Therefore, on etching the barrier metal film 203, the barrier metal film 203 is preferably etched up to the middle of the second interlayer insulator 202.

Figure 7:
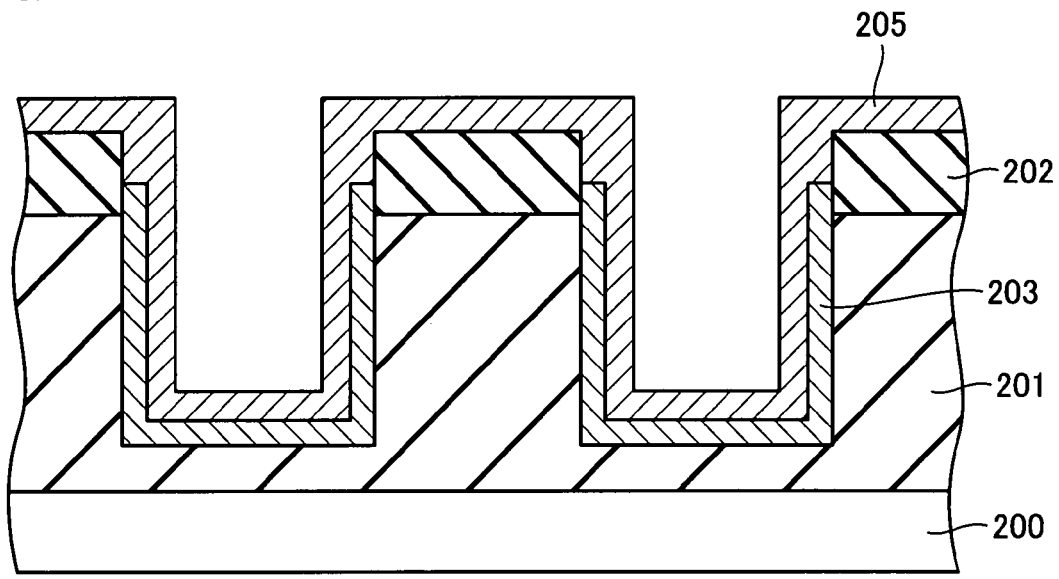
FIG. 7 shows a process step of producing the wiring structure in the semiconductor device of the first embodiment.
Figure 8:
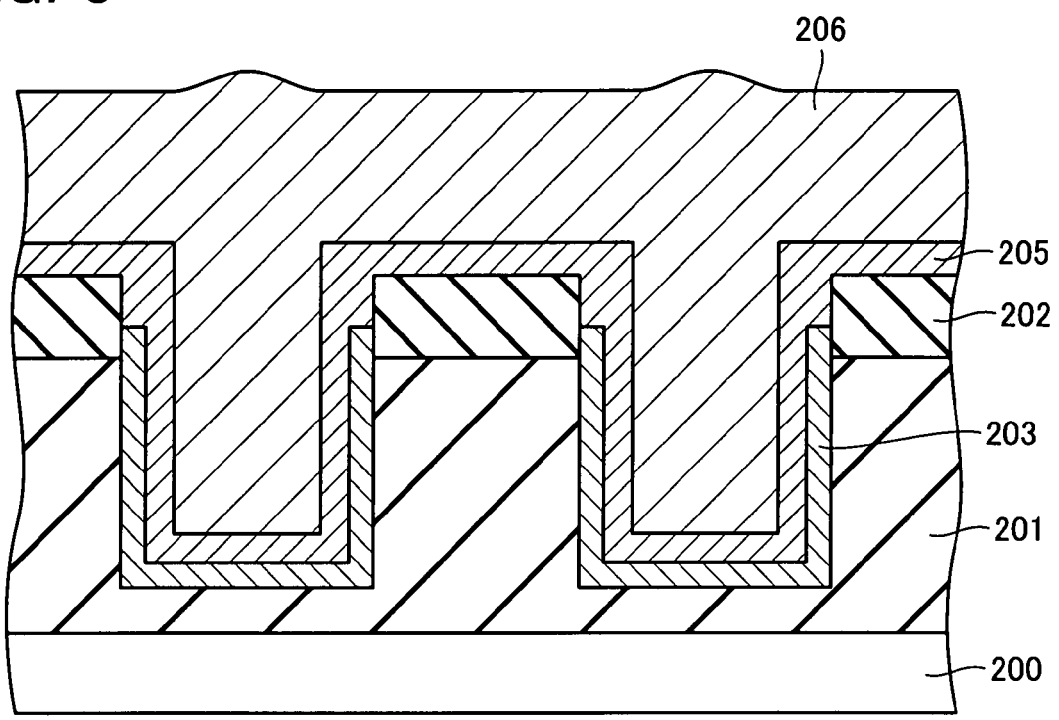
FIG. 8 shows a process step of producing the wiring structure in the semiconductor device of the first embodiment.
Figure 9:
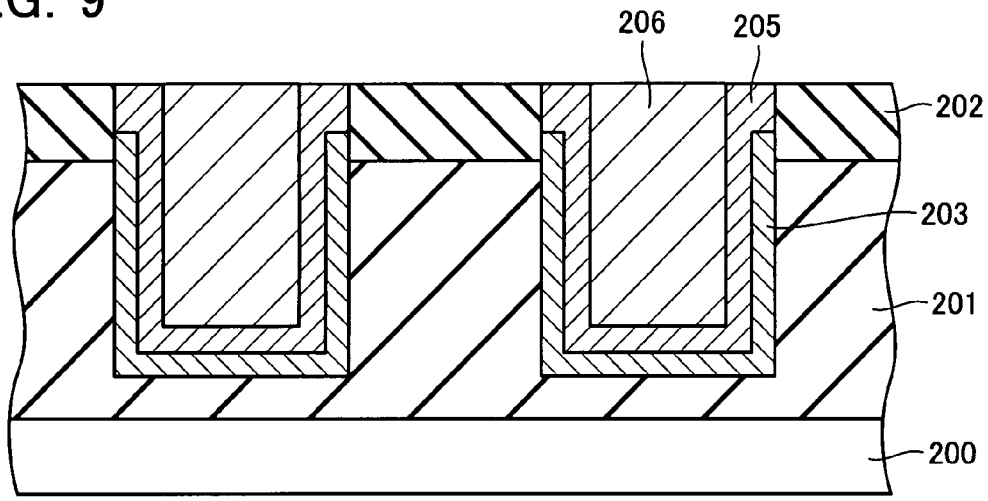
FIG. 9 shows a process step of producing the wiring structure in the semiconductor device of the first embodiment.

Thereafter, a process of plasma etching is executed to peel off the photoresist 204. Then, a process of ECP is used to form the first Cu wiring layer 205 along the inner wall in the wiring trench T1, leaving a recess inside the wiring trench T1 as shown in FIG. 7. The first Cu wiring layer 205 may be formed with two or more laminated Cu layers. The second Cu wiring layer 206 is then deposited over the entire surface of the semiconductor substrate 200 including the recess using a process of PVD, CVD, electroless plating, electrolytic plating or the like and buried in the recess inside the first Cu wiring layer 205 (see FIG. 8). The first Cu wiring layer 205 and the second Cu wiring layer 206 have a total thickness of deposition made thicker than the thickness of the film finally left in the wiring shape. Thereafter, a process of CMP is applied to planarize the first Cu wiring layer 205 and the second Cu wiring layer 206 to complete the Cu wiring or via-hole as shown in FIG. 9.

Figure 10:
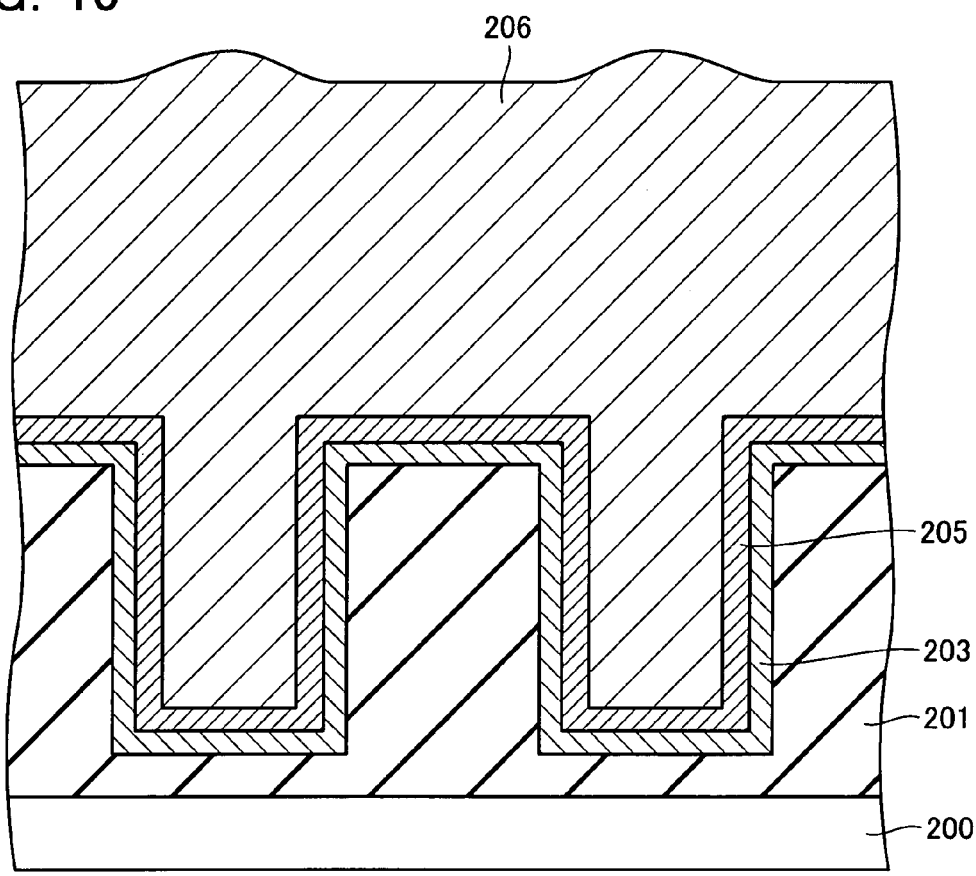
FIG. 10 shows a process step of producing a wiring structure in a semiconductor device of a referential example.
Figure 11:
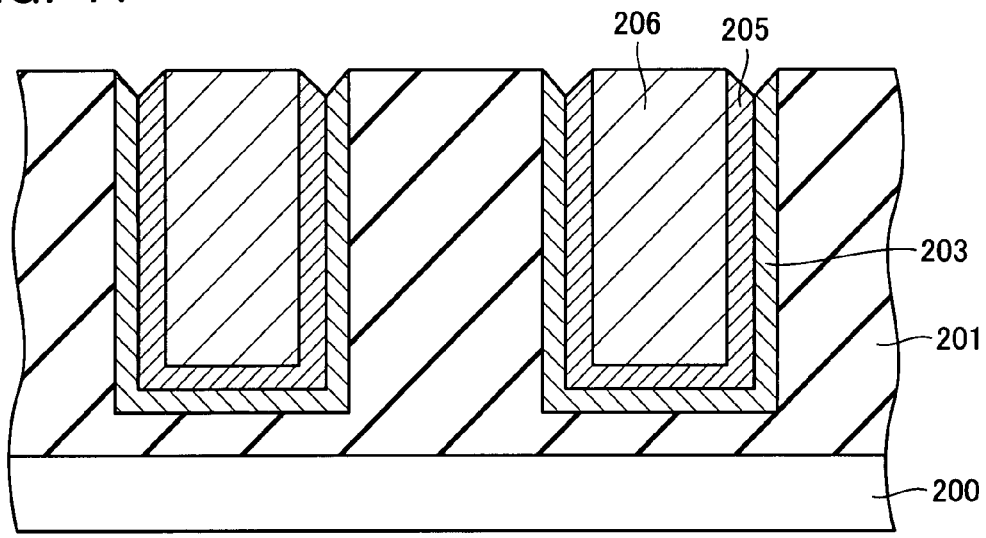
FIG. 11 shows a process step of producing the wiring structure in the semiconductor device of the referential example.

In this embodiment, as described in FIG. 6, the upper end of the barrier metal film 203 is etched back to near the middle of the second interlayer insulator 202 to eliminate the influence from the so-called battery effect and provide low-resistance, high-reliability Cu wiring. This is described in comparison with a referential example shown in FIGS. 10 and 11. In FIG. 10, in a wiring trench formed in an interlayer insulator 201, a barrier metal film 203 is formed and then Cu wiring layers 205, 206 are formed like the embodiment. The step of etching back an upper end of the barrier metal film 203 is, however, not executed as described in FIG. 6. Therefore, the barrier metal film 203 remains also on the upper end and the outside of the wiring trench. If a process of CMP is executed in this state to planarize the Cu wiring, a battery effect arises between the barrier metal film 203 and the Cu wiring layers 205, 206. The battery effect is a phenomenon caused by CMP slurry when a CMP process is performed because of different ionization tendencies of the barrier metal film and the Cu wiring layer, thereby melting the films around the junction between the barrier metal film and the Cu wiring layer. Therefore, as shown in FIG. 11, the upper end of the Cu wiring layer 205 and the barrier metal film 203 melt and form a recess. This recess may cause an increase in wiring resistance and via-hole resistance. It also causes a problem deteriorating the reliability of wiring. With this regard, in this embodiment, the barrier metal film 203 is etched back at the upper end as described above. Thus, the wiring layers 205, 206 both can not be CMP-removed, resulting in no battery effect. Accordingly, it is possible to prevent an increase in wiring resistance and via-hole resistance from occurring and to keep higher reliability of wiring.

Second Embodiment

A method of manufacturing a semiconductor device according to a second embodiment will be described next with reference to FIGS. 12-21. In this embodiment, different from the process steps of the first embodiment, the wiring trench T1 is formed only in the interlayer insulator 201 and Cu wiring is formed therein. The second interlayer insulator 202 is formed later as described below with reference to the drawings.

Figure 12:
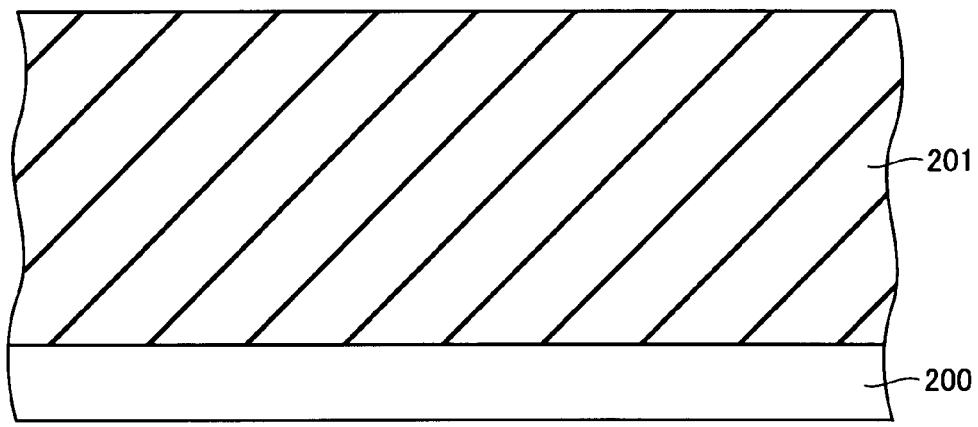
FIG. 12 shows a process step of producing a wiring structure in a semiconductor device of a second embodiment of the present invention.
Figure 13:
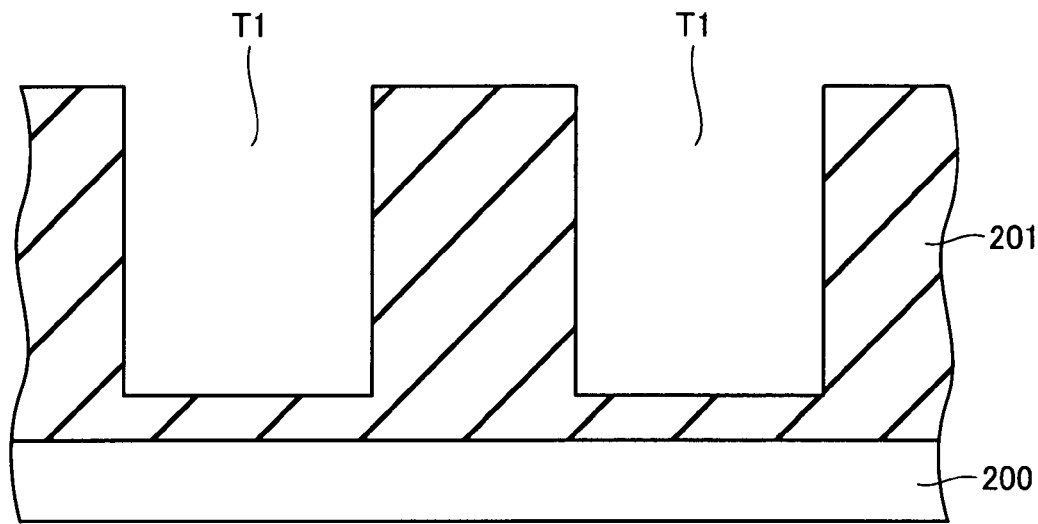
FIG. 13 shows a process step of producing the wiring structure in the semiconductor device of the second embodiment of the present invention.

First, as shown in FIG. 12, the first interlayer insulator 201 is formed over the semiconductor substrate 200 through a process of plasma CVD or coating. Next, a photoresist film is formed over the first interlayer insulator 201 and patterned through a process of photolithography. Then, the patterned photoresist is employed as a mask to form the wiring trench T1 as shown in FIG. 13 through a process of RIE (Reactive Ion Etching).

Figure 14:
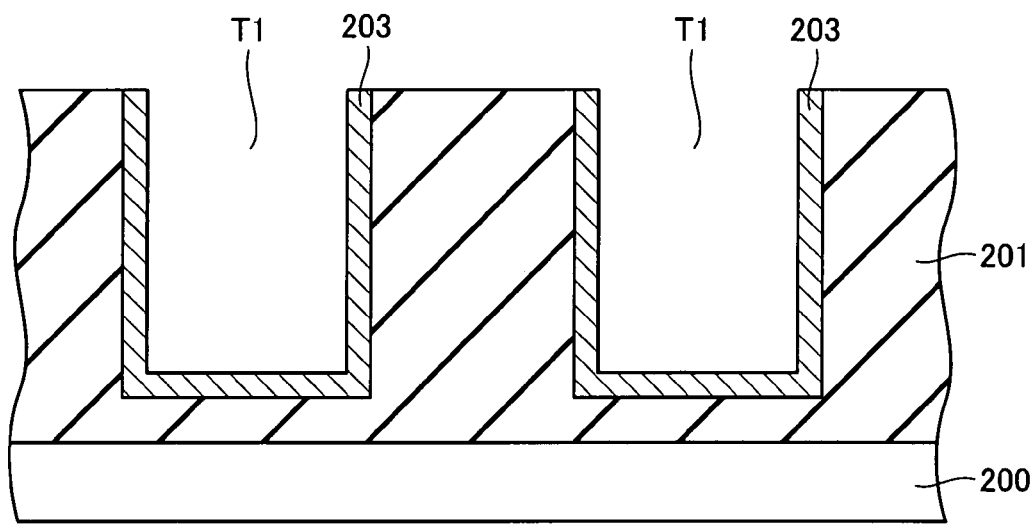
FIG. 14 shows a process step of producing the wiring structure in the semiconductor device of the second embodiment of the present invention.
Figure 15:
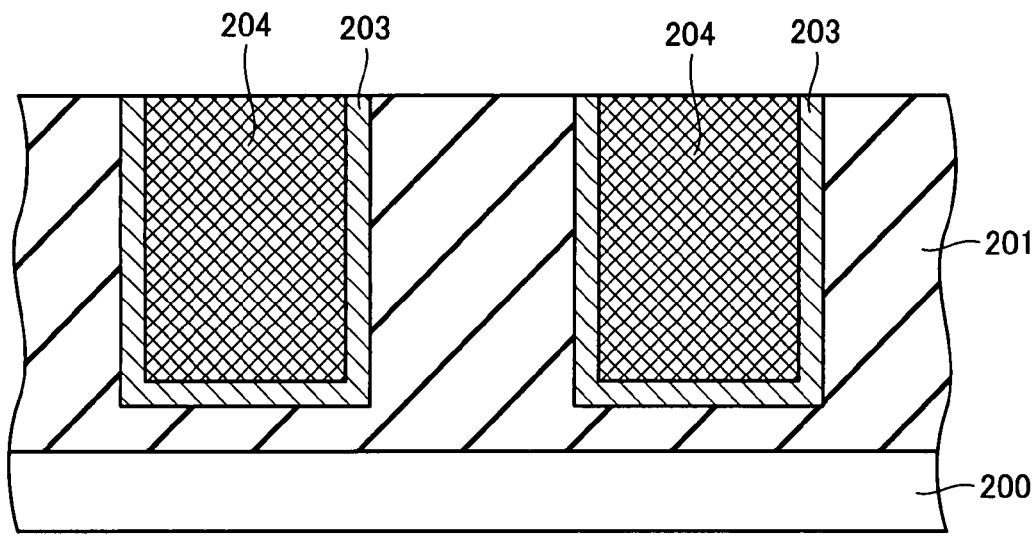
FIG. 15 shows a process step of producing the wiring structure in the semiconductor device of the second embodiment of the present invention.

Thereafter, as shown in FIG. 14, the barrier metal film 203 operative to prevent Cu contained in the Cu wiring from diffusing into the first interlayer insulator 201 is formed over the entire inner wall in the wiring trench T1. Subsequently, photoresist 204 is deposited over the semiconductor substrate 200 including the interior of the wiring trench T1. Thereafter, a process of CMP (Chemical Mechanical Polishing) is executed to remove the photoresist 204 from the outside of the wiring trench T1 to fill the interior of the wiring trench T1 with the photoresist 204 (see FIG. 15). In this state the barrier metal film 203 is exposed through the surface at the upper end of the wiring trench T1.

Figure 16:
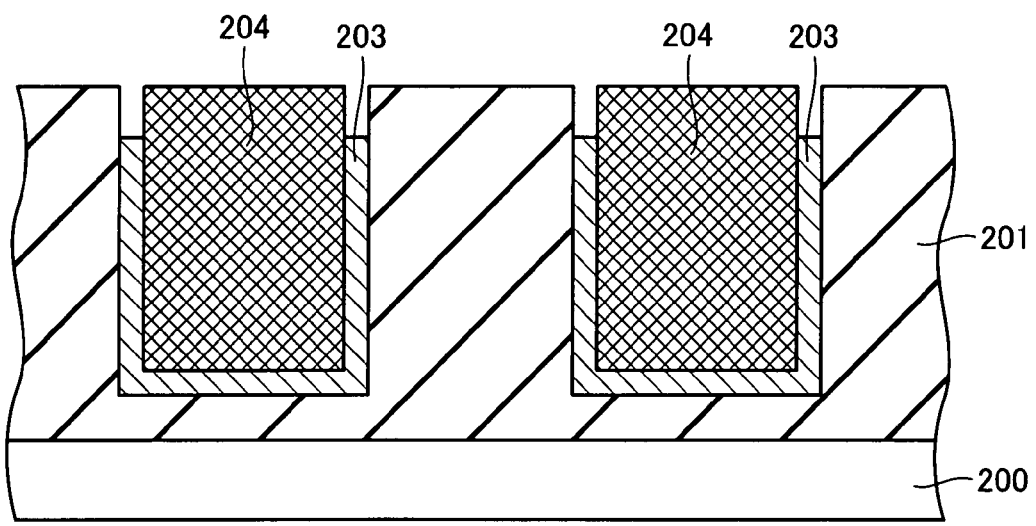
FIG. 16 shows a process step of producing the wiring structure in the semiconductor device of the second embodiment of the present invention.
Figure 17:
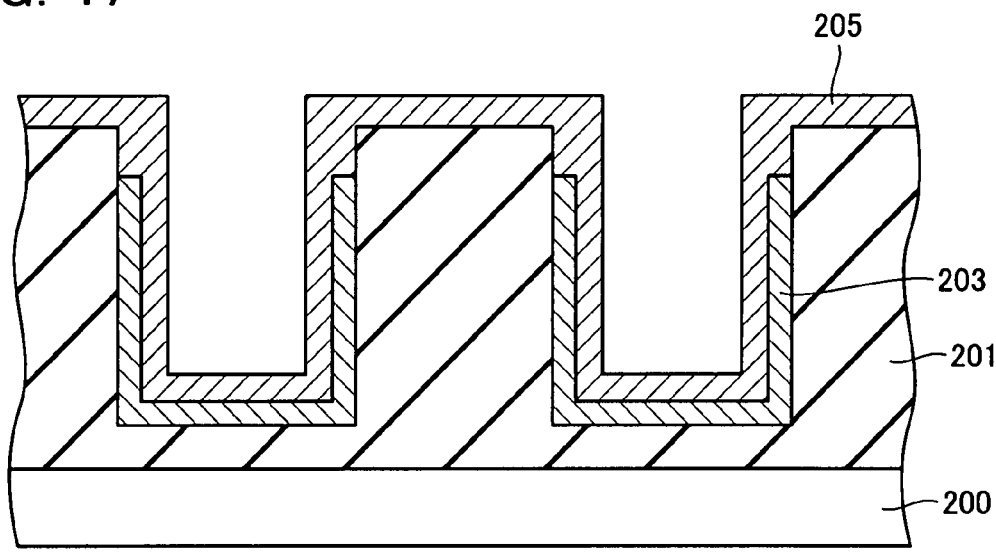
FIG. 17 shows a process step of producing the wiring structure in the semiconductor device of the second embodiment of the present invention.
Figure 18:
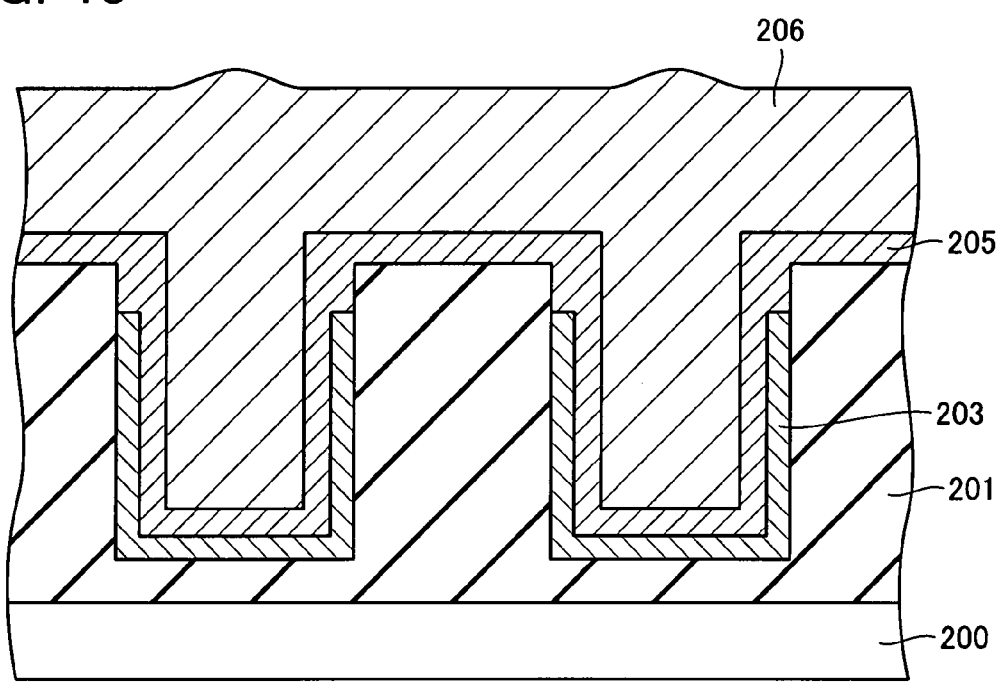
FIG. 18 shows a process step of producing the wiring structure in the semiconductor device of the second embodiment of the present invention.
Figure 19:
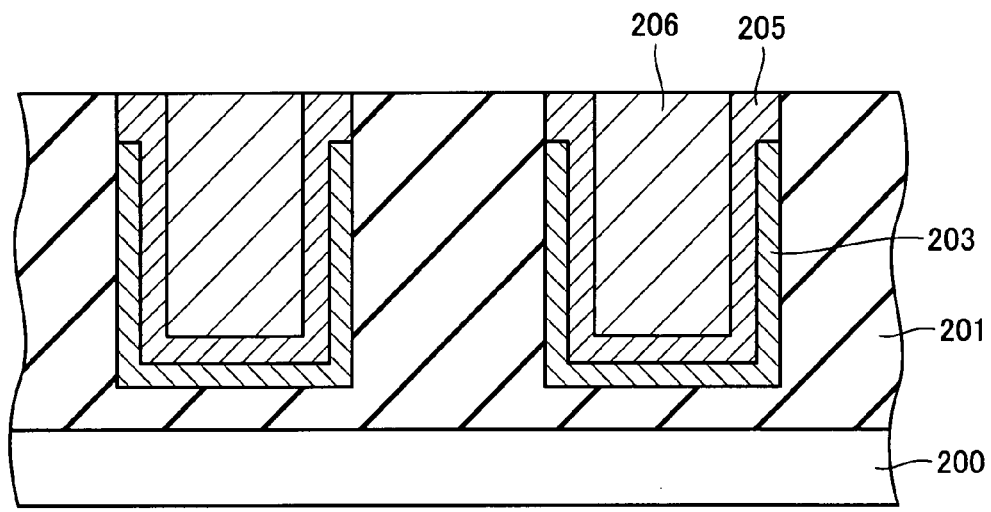
FIG. 19 shows a process step of producing the wiring structure in the semiconductor device of the second embodiment of the present invention.
Figure 20:
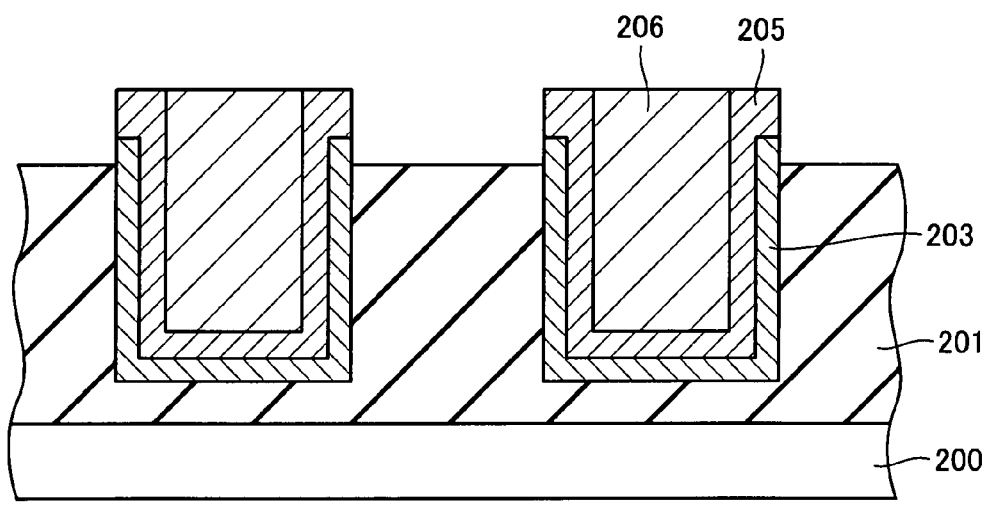
FIG. 20 shows a process step of producing the wiring structure in the semiconductor device of the second embodiment of the present invention.
Figure 21:
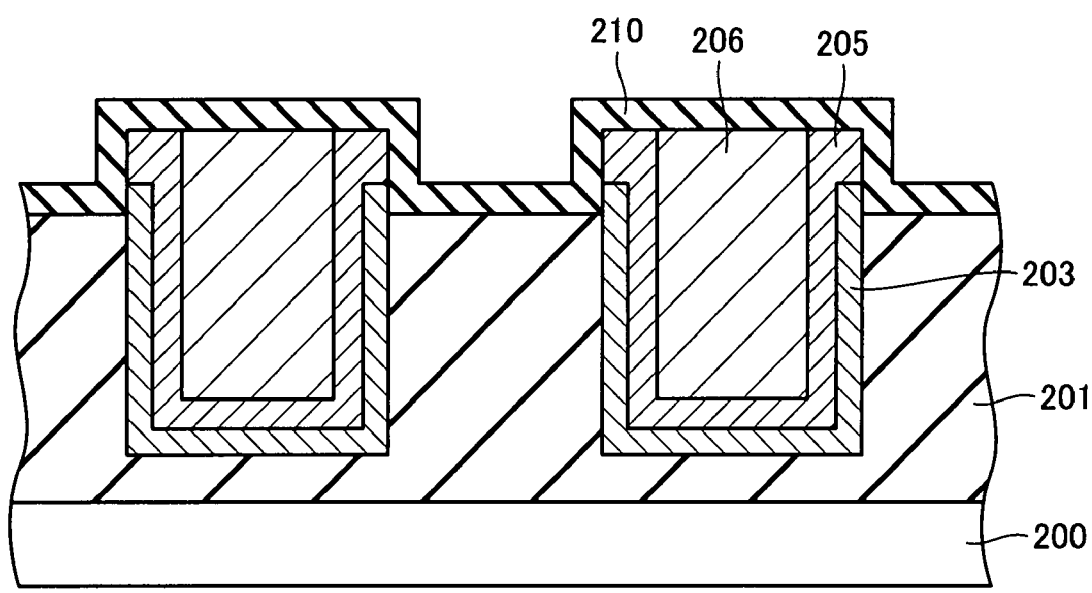
FIG. 21 shows a process step of producing the wiring structure in the semiconductor device of the second embodiment of the present invention.

Next, the photoresist 204 is employed as a mask to execute a RIE process for etching back the upper end of the barrier metal film 203 (see FIG. 16). Thereafter, a process of plasma etching is executed to peel off the photoresist 204. Then, a process of ECP is used to form the first Cu wiring layer 205 along the inner wall in the wiring trench T1, leaving a recess inside the wiring trench T1 as shown in FIG. 17. The first Cu wiring layer 205 may be formed with two or more laminated Cu layers. The second Cu wiring layer 206 is then deposited over the entire surface of the semiconductor substrate 200 including the recess using a process of PVD, CVD, electroless plating, electrolytic plating or the like and buried in the recess inside the first Cu wiring layer 205 as shown in FIG. 18. The first Cu wiring layer 205 and the second Cu wiring layer 206 have a total thickness of deposition made thicker than the thickness of the film finally left in the wiring shape. Thereafter, a process of CMP is applied to planarize the first Cu wiring layer 205 and the second Cu wiring layer 206 (FIG. 19). In this state, the first Cu wiring layer 205 is brought into contact with the first interlayer insulator 201, leaving the possibility of diffusing Cu into the first interlayer insulator 201. Then, in this embodiment the first interlayer insulator 201 is etched back to a downward part lower than an interface between the first Cu wiring layer 205 and the barrier metal film 203 as shown in FIG. 20 such that the barrier metal film 203 is exposed to external and the Cu wiring layers 205, 206 are isolated from the first interlayer insulator 201. If the first interlayer insulator 201 is a SiOx-based film in this case, a HF-based wet etching may be applied to etch back the film. Subsequently, as shown in FIG. 21, the second interlayer insulator 210, or a film of SiN, SiC or SiCN, is formed over the entire surface of the substrate. Also in this step, in the CMP step of FIG. 19, the barrier metal film and the Cu wiring layer are not planarized at the same time. Therefore, it is possible to cause no battery effect and exert the same effect as that of the first embodiment.

The embodiments of the invention have been described above though the present invention is not limited to these embodiments but rather may be given various variations, replacements and additions without departing the scope of the invention.

What is claimed is:

1. A semiconductor device provided with Cu wiring formed with a copper that are buried in a wiring trench formed in an interlayer insulator, comprising:
   the interlayer insulator including a first interlayer insulator formed over a semiconductor substrate and a second interlayer insulator formed on the first interlayer insulator;

a barrier metal film formed on an inner wall of the wiring trench except an upper part thereof higher than a vicinity of the middle of the second interlayer insulator; and a Cu wiring including a first Cu wiring and a second Cu wiring, the first Cu wiring formed on the barrier metal film along the inner wall of the wiring trench to leave a recess inside the wiring trench and brought into contact with the second interlayer insulator at the upper part of the wiring trench to cover the upper end of the barrier metal film, and the second Cu wiring formed to bury the wiring trench including the recess.

2. The semiconductor device according to claim 1, wherein the first interlayer insulator is an insulator film containing part or all of elements of Si, O, N, F, C, H, B and P.

3. The semiconductor device according to claim 1, wherein the first interlayer insulator is a laminated film.

4. The semiconductor device according to claim 1, wherein the barrier metal film is composed of Ta, TaN, TaSiN, Ti, TiN, Mn, MnO, Nb, NbN, WN or WSiN.

5. The semiconductor device according to claim 1, wherein the second interlayer insulator is mainly composed of SiN, SiC or SiCN.

6. A method of manufacturing a semiconductor device provided with Cu wiring formed with a metal that are buried in a wiring trench formed in an interlayer insulator, comprising:

forming a first interlayer insulator over a semiconductor substrate;

forming a second interlayer insulator on the first interlayer insulator;

forming a wiring trench through the second interlayer insulator to the first interlayer insulator;

forming a barrier metal film on an inner wall in the wiring trench;

burying resist in the wiring trench;

etching back the barrier metal film to an upper part higher than an interface between the first and second interlayer insulator so as not to expose the interface;

peeling off the resist;

forming a first Cu wiring layer in the wiring trench to bring into contact with the second interlayer insulator at the upper part of the wiring trench to cover the upper end of the barrier metal film, leaving a recess inside the wiring trench; and burying copper in the recess to form a second Cu wiring layer.

7. The method of manufacturing a semiconductor device according to claim 6, wherein the first interlayer insulator is formed through a process of plasma CVD or coating.

8. The method of manufacturing a semiconductor device according to claim 6, wherein the second interlayer insulator is formed through a process of plasma CVD.

9. The method of manufacturing a semiconductor device according to claim 6, wherein the wiring trench is formed through a process of RIE with a mask of photoresist formed on the second interlayer insulator and patterned through a process of photolithography.

10. The method of manufacturing a semiconductor device according to claim 6, wherein etching back the barrier metal film includes etching back the barrier metal film to the middle of the second interlayer insulator.

11. The method of manufacturing a semiconductor device according to claim 6, wherein the first Cu wiring layer is formed through a process of ECP.

12. The method of manufacturing a semiconductor device according to claim 6, wherein burying copper in the recess to form the second Cu wiring layer is performed through a process of PVD, CVD, electroless plating or electrolytic plating.

13. A method of manufacturing a semiconductor device provided with Cu wiring formed with a metal that are buried in a wiring trench formed in an interlayer insulator, comprising:

forming a first interlayer insulator over a semiconductor substrate;

forming a wiring trench in the first interlayer insulator;

forming a barrier metal film on an inner wall in the wiring trench;

burying resist on the barrier metal film;

etching back the barrier metal film;

peeling off the resist;

forming a first Cu wiring layer in the wiring trench to bring into contact with the second interlayer insulator at the upper part of the wiring trench to cover the upper end of the barrier metal film, leaving a recess inside the wiring trench;

burying copper in the recess to form a second Cu wiring layer;

etching back the first interlayer insulator to a downward part lower than an interface between the first Cu wiring layer and the barrier metal film so as to expose the barrier metal film; and forming a second interlayer insulator over the entire surface of the semiconductor device.

* * * * *